United States Patent [19]

Eklund et al.

[11] Patent Number: 5,656,524

[45] Date of Patent: Aug. 12, 1997

[54] METHOD OF FORMING A POLYSILICON RESISTOR USING AN OXIDE, NITRIDE STACK

[75] Inventors: Robert H. Eklund; Douglas A. Prinslow; David B. Scott, all of Plano, Tex.

[73] Assignee: Texas Instruments Incorporated, Dallas, Tex.

[21] Appl. No.: 478,301

[22] Filed: Jun. 7, 1995

Related U.S. Application Data

[62] Division of Ser. No. 239,020, May 6, 1994, abandoned.

[51] Int. Cl.$^6$ ................................................. H01L 21/70
[52] U.S. Cl. ..................... 438/238; 438/384; 438/385; 438/647; 438/532
[58] Field of Search ........................... 437/60, 47, 200, 437/918; 148/DIG. 46

[56] References Cited

U.S. PATENT DOCUMENTS

| | | | |
|---|---|---|---|
| 3,864,817 | 2/1975 | Lapham, Jr. et al. | 437/918 |
| 4,021,789 | 5/1977 | Furman et al. | 437/60 |
| 4,210,465 | 7/1980 | Brower | 437/60 |
| 4,212,684 | 7/1980 | Brower | 437/60 |
| 4,466,179 | 8/1984 | Kasten | 437/918 |
| 4,467,519 | 8/1984 | Glang et al. | 437/60 |
| 5,010,032 | 4/1991 | Tang et al. | 437/57 |
| 5,013,677 | 5/1991 | Hozumi | 437/918 |
| 5,135,882 | 8/1992 | Karniewizc | 437/60 |
| 5,169,794 | 12/1992 | Iranmesh | 437/57 |
| 5,231,042 | 7/1993 | Ilderem et al. | 437/200 |
| 5,236,857 | 8/1993 | Eklund et al. | 437/60 |
| 5,348,901 | 9/1994 | Chen et al. | 437/47 |
| 5,356,825 | 10/1994 | Hozumi et al. | 437/60 |
| 5,384,278 | 1/1995 | Singlevich | 437/52 |
| 5,384,288 | 1/1995 | Ying | 437/240 |
| 5,395,783 | 3/1995 | Baumann et al. | 437/52 |
| 5,424,239 | 6/1995 | Sweeney | 437/60 |
| 5,462,889 | 10/1995 | Tsukada et al. | 437/60 |

*Primary Examiner*—George Fourson
*Assistant Examiner*—Scott Kirkpatrick
*Attorney, Agent, or Firm*—Jacqueline J. Garner; W. James Brady, III; Richard L. Donaldson

[57] ABSTRACT

A polysilicon resistor (40) includes a field oxide layer (12) and a polysilicon layer (20) that covers a portion of field oxide layer (12). The polysilicon layer (20) possesses a predetermined electrical resistance value. Nitride/oxide stack (42) covers a predetermined portion of the polysilicon layer (20) and forms at least one exposed location of polysilicon layer (20) on which not to implant a dopant to achieve a predetermined resistance value. Silicide layer (34) covers exposed location.

6 Claims, 2 Drawing Sheets

METHOD OF FORMING A POLYSILICON RESISTOR USING AN OXIDE, NITRIDE STACK

This is a division of application Ser. No. 08/239,020, filed May 6, 1994, now abandoned.

TECHNICAL FIELD OF THE INVENTION

The present invention relates to semiconductor device fabrication and the resulting devices and, more particularly, to a method for forming a polysilicon resistor and resistors resulting therefrom.

BACKGROUND OF THE INVENTION

The integration of MOSFET structures and bipolar transistors on a single substrate has become very desirable. In addition, silicon on insulator (SOI) technology offers the highest performance for a given feature size due to the minimization of parasitic capacitance.

As is well known in the art, digital and linear functions are often performed by integrated circuits using either bipolar or metal-oxide-semiconductor (MOS) technology. Bipolar integrated circuits, of course, provide higher speed operation and greater drive currents than the MOS circuits, at the cost of higher power dissipation, especially when compared against complementary MOS (CMOS) circuits. Recent advances in manufacturing technology have allowed the use of both bipolar and CMOS transistors in the same integrated circuit (commonly referred to as BiCMOS devices). Further exploitation of the high current driving capabilities of the bipolar transistor is important to obtaining even higher levels of bipolar or merged bipolar CMOS integration.

Resistors for BiCMOS integrated circuits have typically been diffused resistors. One process for forming a diffused resistor in a semiconductor device uses a 0.8 micron BiCMOS process. In that process, a 600 $\Omega/\square$ diffused resistor results. The length of the resistor is defined by a polysilicon layer which blocks silicidation of the resistor body. One of the downfalls of this resistor is its large parasitic capacitance. This parasitic capacitance slows signal flows through the circuit. Parasitic capacitance exists between the resistor and the polysilicon layer above it as well as between the resistor and the adjacent N-well.

For more BiCMOS integrated circuits that have use in advanced technologies such as asynchronous transfer mode (ATM) telephone switching technology as well as generic application specific integrated circuit (ASIC) technologies, parasitic capacitance problems degrade circuit performance to less than acceptable levels.

SUMMARY OF THE INVENTION

There is a need, therefore, for an improved resistor and process for forming the resistor that eliminates or substantially reduces parasitic capacitance that exists between the diffused resistor and the polysilicon layer above it, as well as, the parasitic capacitance that exists between the resistor and its associated transistor N-well.

The present invention, accordingly, provides a method for forming a polysilicon resistor and the resistor resulting therefrom that overcome or substantially reduce limitations associated with known integrated circuit resistors and methods for forming such resistors. The present invention replaces the known diffused resistor with a polysilicon resistor. The polysilicon resistor is located on the field oxide with the metal level oxide (MLO) dielectric above it. The present invention provides a method for forming a polysilicon resistor and the resistor resulting therefrom that has a significantly lower parasitic capacitance than that which exists in the known diffused resistors. The polysilicon resistor of the present invention provides improved circuit performance, especially in BiCMOS circuits.

One aspect of the present invention is a polysilicon resistor that includes a field oxide layer and a polysilicon layer. The polysilicon layer covers a portion of the field oxide layer and has a predetermined electrical resistance value. A dopant is implanted into the polysilicon layer for establishing the predetermined resistance value. A nitride/oxide stack covers a predetermined portion of the polysilicon layer and forms at least one exposed location of the polysilicon layer which is not silicided. A silicide layer covers the exposed ends of the polysilicon layer.

According to another aspect of the present invention, there is provided a method for forming a polysilicon resistor that first forms a layer of polysilicon on a field oxide layer. The polysilicon is implanted with arsenic to produce a predetermined resistance level. For example, one embodiment has a 500 $\Omega/\square$ resistance level. The body of the polysilicon resistor is patterned and formed with the gate pattern and etch steps. Next, an oxide/nitride sidewall stack is deposited, patterned, and etched. The oxide/nitride stack that remains over the polysilicon resistor serves the purposes of (1) defining the length of the resistor by protecting it from further implants and (2) defining the length of the polysilicon resistor by forming a silicide block. This results in the process only siliciding the heads of the resistor. In one embodiment, the heads of the resistor may be implanted with an $N^+$ source/drain implant through the oxide that remains. On the other hand, the $N^+$ source/drain mask may be controlled to leave the entire polysilicon resistor covered with photoresist. After completing the source/drain implants, the oxide that remains over these resistor heads is removed with a blanket etch. The exposed silicon is then silicided. The resistor of the present invention may then be covered with the appropriate MLO layer.

A technical advantage of the present invention is that it forms a polysilicon resistor having decreased parasitic capacitance in comparison with parasitic capacitance values that exist with known diffused resistors.

Another technical advantage of the present invention is that it provides increased circuit performance over known diffused resistors.

BRIEF DESCRIPTION OF THE DRAWINGS

The invention and its modes of use and advantages are best understood by reference to the following description of illustrative embodiments when read in conjunction with the accompanying drawings, wherein.

DETAILED DESCRIPTION OF THE INVENTION

The illustrative embodiments of the present invention are best understood by referring to the FIGUREs, wherein like numerals are used for like and corresponding parts of the various components.

The present invention provides a process flow for the integration of a polysilicon resistor into a BiCMOS process. The resistor is built between a field oxide layer and a metal level oxide (MLO) layer and has significantly improved circuit performance over known diffused resistors. MLO is a dielectric layer located on either side of a metal interconnect layer. In the invention, it is the dielectric layer below the first metal interconnect layer. The circuit performance arises in part from a reduction in parasitic capacitance of the polysilicon resistor relative to that which exists in the currently-used diffused resistors. In addition, the process of the present embodiment is also more controllable, because the polysilicon resistor that results from the process is defined by an etch area rather than a diffusion area. The etch is the same etch that defines the BiCMOS gate polysilicon and is, therefore, a precise, well-defined process.

The present method forms a polysilicon resistor by first patterning and etching the sidewall spacer to leave the dielectric over the body of the resistor and, thereby, prevent siliciding. A particularly important aspect of the present embodiment is its use in a BiCMOS process. In addition, the present invention uses arsenic as the dopant in the BiCMOS process. The illustrative embodiments of the invention herein described include two process flows. The first-described process flow may be preferable for most applications. However, there may be other considerations that make the second-described process flow preferable.

Figure 1:
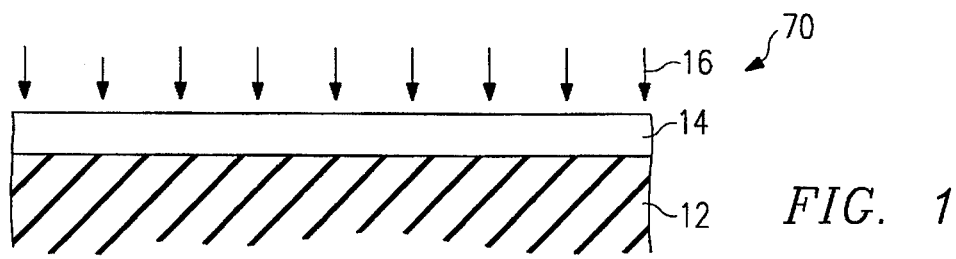
FIG. 1 is a cross-sectional conceptual diagram that illustrates initial deposition and implantation steps of the present embodiment.

The first process flow may be described by beginning at FIG. 1 which shows fabrication process device 10 in its initial stage as including field oxide layer 12. On field oxide layer 12, polysilicon layer 14 is first deposited. On this structure an arsenic (As) implant occurs as indicated by arrows 16. This step forms the foundation for subsequent steps in forming the resistor of the present embodiment from fabrication process device 10. Prior to forming the resistor of the present embodiment, however, it is necessary to form the associated BiCMOS transistor. Accordingly, the following discussion describes steps that lead to the structure of FIG. 1. These steps and the structure that results from them, however, are not shown in FIG. 1.

The first step in the process flow that leads to the FIG. 1 fabrication process device 10, therefore, is to deposit a layer of polysilicon to a thickness of 1250±100 Å. This is the first polysilicon layer of the split-polysilicon deposition process of the present embodiment. Next, a layer of photoresist is applied to define the base region of the associated transistor. This pattern also opens up the above-mentioned base poly such that it is also removed from the region upon which the 2500 Å poly resistor will be built. If the 3750 Å poly resistor is desired, the poly resistor region is not exposed with the current pattern, leaving the 1250 Å poly remaining in this area. Then, a polysilicon etch occurs which removes the first polysilicon layer from regions exposed in the resist. Then, the step of implanting the first polysilicon to form the extrinsic base region of the associated transistor occurs. If the 3750 Å poly resistor is to be built, the poly resistor region is blocked from the implant by photoresist. Following the polysilicon etch, photoresist is removed with ash and poly-ears processes.

The poly-ears process includes two different wet chemical processes used sequentially; a nanostrip followed by a megasonic strip process.

After the poly-ears resist strip, the next step is to deposit an oxide layer using a low pressure chemical vapor deposition (LPCVD) process to form an oxide layer to a thickness of 300±30 Å. Next, using an LPCVD nitride process, a nitride layer is deposited to a thickness of 300±30 Å. The deposited oxide and nitride together form the emitter dielectric stack.

The next step is to form a hole in the above-mentioned dielectric down to the silicon, defining the emitter contact. This occurs by patterning a 0.60±0.05 μm wide contact in the dielectric with photoresist and etching the exposed dielectric stack to leave less than 20 Å of oxide remaining.

On field oxide layer 12, polysilicon resistor 10 of the present embodiment may be formed. With reference to FIG. 1, therefore, the second part of the split-poly deposition process forms polysilicon layer 14 on field oxide layer 12. This is done by a deglaze of the first polysilicon layer using a 10% hydrofluoric acid compound for 20 seconds followed by the deposition of the second polysilicon layer to a thickness of 2500±200 Å in the present embodiment. The total thickness of polysilicon layer 14 in FIG. 1 will be either 2500 Å or 3750 Å, depending on whether or not the first polysilicon layer was removed in a previous etch.

If the 2500 Å polysilicon resistor is built, the dielectric stack underneath the polysilicon resistor will include the oxide/nitride emitter dielectric, resulting in the polysilicon resistor being built on nitride.

Polysilicon layer 14 is then implanted with the desired dopant such that the desired sheet resistance is obtained. For example, for the 2500 Å polysilicon resistor, a 6.0E15 ion/cm$^2$ As implant at 150 KeV will result in a sheet resistance of 500 Ω/□. This is implant 16 of FIG. 1.

The next step is to block the polysilicon resistor from any remaining emitter implants with a photoresist pattern. Then, the process of the present embodiment anneals the polysilicon layer 14 to diffuse and activate the arsenic throughout polysilicon layer 14. This step, for example, takes 27 minutes at a temperature of 900° C.

Figure 2A:
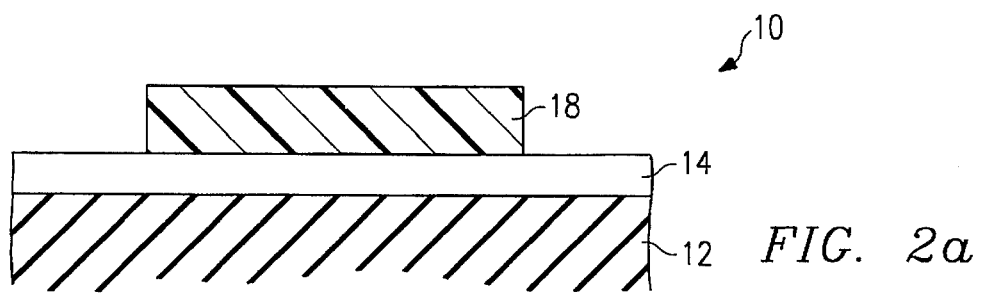
FIGS. 2a and 2b illustrate forming the polysilicon resistor body using photoresist etch steps.
Figure 2B:
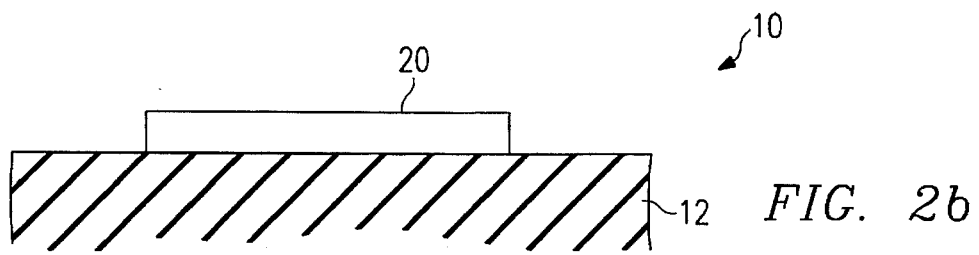

Referring to FIGS. 2a and 2b, therefore, fabrication process device 10 appears in its form before the polysilicon etch. In FIG. 2a, polysilicon layer 14 covers field oxide layer 12. Photoresist pattern 18 covers a predetermined portion of polysilicon layer 14. The next step is to define the polysilicon resistor body with a photoresist process.

FIG. 2b demonstrates the result of the gate etch and the resulting polysilicon resistor player 20. Polysilicon layer 20 remains as a result of photoresist pattern 18 that protects a predetermined portion of polysilicon layer 14 from the photolithographically patterned etch. The polysilicon gate etchstep etches away all the unmasked polysilicon and is followed by removal of the photoresist and deposition of a 300 Å cap oxide. Then, a photoresist process takes place followed by the transistor implant of 6.0×10$^{13}$ ion density at 60 KeV. Because of the photoresist, this implant does not affect the resistor. The next step is then to remove the existing photoresist followed by the necessary poly-ears resist strip.

Figure 3A:
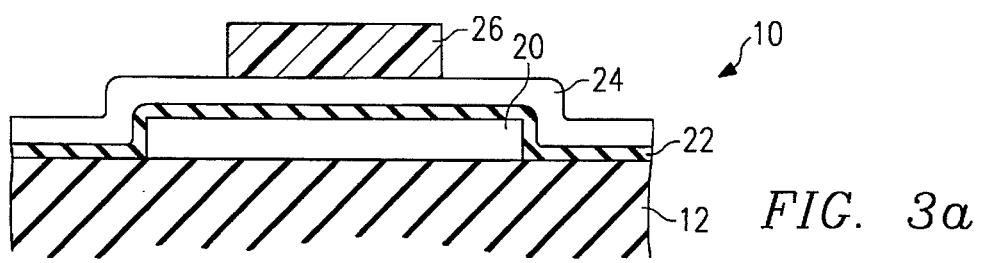
FIGS. 3a and 3b depict intermediate steps of forming the oxide/nitride stack according to the present embodiment.
Figure 3B:
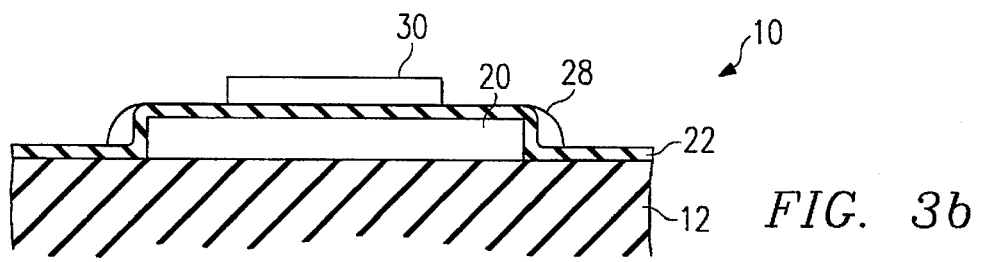

FIGS. 3a and 3b show further intermediate results that exist for fabrication process device 10 as follows. Referring to FIG. 3a, on field oxide layer 12 is polysilicon layer 20. Oxide layer 22 covers polysilicon layer 20 and that portion of field oxide layer not covered by polysilicon layer 20. Nitride layer 24 cover oxide layer 22. Photoresist pattern 26 covers a predetermined portion of nitride layer 24 and oxide layer 22 covering polysilicon layer 20. This pattern defines the body of the polysilicon resistor.

FIG. 3b shows the fabrication process device 10 after a nitride etch and resist strip. That is, oxide layer 22 continues to cover polysilicon layer 20 and the exposed portion of field oxide layer 12. After nitride etch and resist strip, however, nitride stack 30 remains as does nitride sidewall 28. Nitride stack 30 is unique to the present invention wherein an LPCVD nitride layer of a thickness of 1000 Å±100 Å is used.

Figure 4:
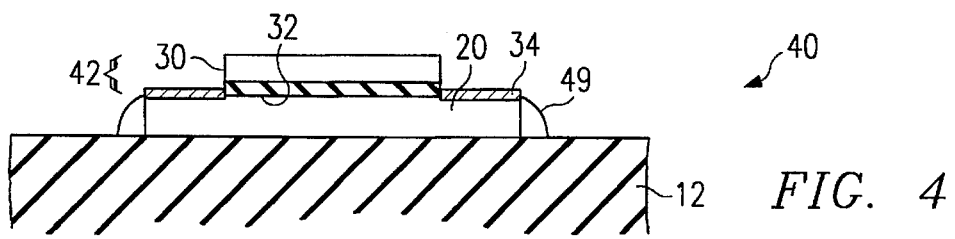
FIG. 4 shows a conceptual cross-sectional view of the complete resistor of the present embodiment.

FIG. 4 shows the resulting polysilicon resistor 40 of the present embodiment following the formation of nitride/oxide stack 42. Turning more particularly to polysilicon resistor 40 of FIG. 4, there appears polysilicon layer 20 having sidewall 49 on the field oxide layer 12. Covering the exposed portion of polysilicon layer 20 is Silicide layer 34. Nitride layer 30 covers oxide layer 32. In the present embodiment, $N^+$ source/drain implant takes place, followed by a blanket etch which removes that portion of oxide layer 32 which covers polysilicon layer 20 and that portion which nitride layer 30 does not cover. The exposed polysilicon of polysilicon layer 20 is then silicided to form silicide layer 34. This step, in essence, completes the formation of polysilicon resistor 40 and conditions it for covering with a metal level oxide (MLO) layer.

Nitride/oxide stack 42 on polysilicon layer 20 serves two purposes. First, oxide/nitride stack 42 defines the length of polysilicon resistor 40 by protecting it from further implants, for example, the source/drain implant. In addition, nitride/oxide stack 42 defines the length of polysilicon resistor 40 by forming a silicide block. As a result, only the heads of the resistor are silicided. Fabrication process device 10 of FIG. 3b permits implanting the heads of polysilicon layer 20 with an $N^+$ source/drain implant through oxide layer 22. If this is not desired, however, the $N^+$ source/drain mask should cover the entire polysilicon resistor with photoresist.

After applying LPCVD nitride layer 24, the next step is to perform a silicide block photoresist step to produce silicide block stack 42 that protects the body of polysilicon resistor 20 from silicidation. This defines the polysilicon resistor 40 length. The body of polysilicon resistor 40 is shorter than polysilicon layer 20. This is because the heads of the resistor need to be exposed. These heads will later contact the MLO layer.

The next step is to perform a sidewall nitride etch that leaves the oxide layer with a thickness of greater than approximately 200 Å. Thereafter, an ash and poly-ears resist strip process removes the undesired photoresist. After the photoresist is removed a first $N^+$ source/drain implant occurs using $4\times10^{14}$ ion/cm$^2$ phosphorus implant using 50 KeV ions. A second $N^+$ source/drain implant using a $3\times10^{15}$ ion/cm$^2$ arsenic implant at 120 KeV occurs next. The phosphorus and arsenic implants are then annealed into the heads of the resistor with an 850° C. process.

In the present embodiment, the $N^+$ source/drain implants go into the heads of polysilicon resistor 40. This decreases the contact resistance between the silicide and the resistor body. A $P^+$ source/drain pattern is then masked off the resistor. In the present embodiment the $P^+$ source/drain implant uses a $2\times10^{15}$ ion/cm$^2$ boron process at a 20 KeV ion energy level. Then, to remove the photoresist, an ash and a poly-ears resist strip takes place. After removing the photoresist, a source/drain anneal lasting 30 minutes at a temperature of 850° C. takes place to activate and diffuse the arsenic and phosphorus dopants.

The next step is to remove the oxide to leave less than 20 Å of oxide. A silicide deglaze next takes place using a 10% hydrofluoric acid for 20 seconds. Then, a 600±50 Å layer of titanium is deposited. This titanium deposition is then reacted with the polysilicon at a temperature of 585° C. for 45 minutes. What remains then is the silicided head of polysilicon resistor 40. After reacting the titanium, a titanium TiN wet strip occurs. This may be a megasonic process lasting of approximately 30 minutes. An anneal process at 750° C. for 30 minutes then occurs to prepare polysilicon resistor 40 for a MLO plasma enhanced TEOS or PETEOS deposition to the thickness of 4500±250 Å. This completes the present process flow for fabrication process device 40 to yield the desired polysilicon resistor.

A technical advantage of the present invention is that it has less parasitic capacitance than do the diffused resistors of known BiCMOS circuits. This presents the positive feature of increasing circuit performance. It is also important to note that the present embodiment is a flexible process. For example, the polysilicon resistor thickness may range from 2500 Å to 3750 Å of polysilicon. The polysilicon resistor implant is a blanket arsenic implant that also serves as part of the emitter implant. The emitter implant, consequently becomes the difference between the desired emitter implant dose and the polysilicon resistor implant dose.

Note that polysilicon resistor 40 heads may be exposed to the $N^+$ source/drain implant. This may help to improve the silicide-to-polysilicon contact resistance, but at the expense of introducing lateral diffusion of arsenic and phosphorus into the body of the resistor when the source/drain anneal is done. This changes the effective length of the resistor. If the head implant is used, the $N^+$ source/drain mask should open up the entire resistor. Oxide/nitride stack 42 blocks the implant from the resistor body. Additionally, the $N^+$ Source/drain implant may need to be done at a zero degree angle to minimize resistor orientation effects.

Other configurations than that described above in connection with FIGS. 1 through 4 may also be practical or desirable for different applications. For example, polysilicon resistor 40 may connect directly to the polysilicon emitter.

Figure 5:
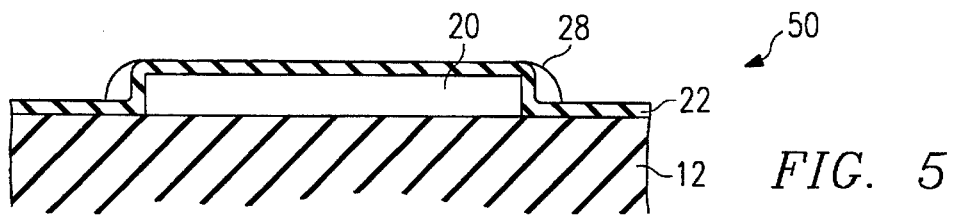
FIG. 5 shows the fabrication process device of an intermediate stage of an alternative embodiment of the present invention.

FIG. 5 shows an alternative device structure 50 that includes field oxide layer 12 on which polysilicon layer 20 is deposited. Oxide layer 22 covers polysilicon layer 20 and field oxide layer 12. Nitride sidewalls 28 attach to oxide layer 22 at the polysilicon layer 20 sidewalls. This is the structure that exists after the nitride sidewall etch in the alternative embodiment. In general, the process for producing alternative embodiment 50 may be essentially similar to the process flow associated with FIGS. 1 through 4 above, with one important exception that, first of all, the nitride sidewall etch is not patterned and leaves at least 200 Å of oxide on the resistor and moat regions.

Figure 6:
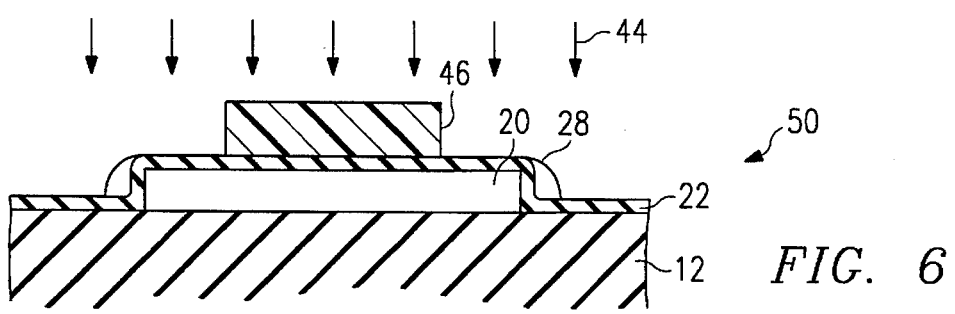
FIG. 6 illustrates the formation of an oxide stack and implant according to the alternative embodiment of FIG. 5.

If the $N^+$ source/drain implant is to be implanted into the resistor heads, the $N^+$ source/drain mask leaves the body of the resistor covered with resist. Thus, as the FIG. 6 arrows 44 show, the arsenic implant goes to photoresist mask 46 that covers oxide layer 22 above polysilicon layer 20. Thus, photoresist pattern 46 allows for the $N^+$ source/drain photoresist process to implant polysilicon layer 20 of alternative fabrication process device 50. The implanted regions of polysilicon layer 20 will be the heads of the polysilicon resistor 50.

The source/drain implant and anneal process may then be performed on alternative fabrication process device 50, followed by a patterned oxide etch. This etch defines the resistor length and opens up areas to be silicided. This approach is useful for electrostatic discharge (ESD) structures, where it is desirable to have unsilicided moats. That is, in ESD structures moat will not be exposed during this oxide etch.

Figure 7:
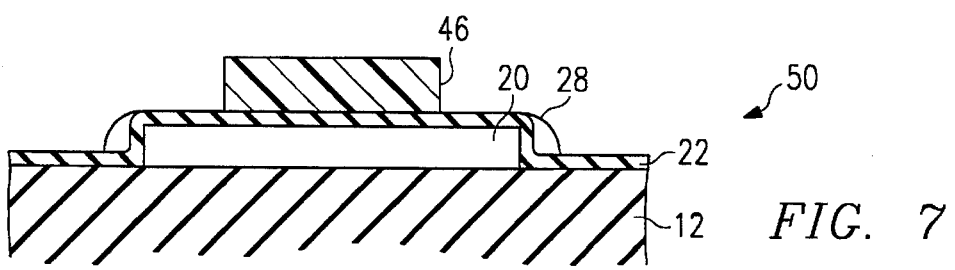
FIG. 7 shows a further intermediate stage of the alternative embodiment of FIG. 5.

As FIG. 7 depicts, alternative fabrication process device 50 includes photoresist pattern 46 that covers oxide layer 22. This shields a portion of oxide layer 22 from oxide etching and, thereby, produces the device 50 of FIG. 8 that includes oxide layer 48. Polysilicon layer 20 is exposed after the oxide etch. Sidewall 49 consists of both oxide and nitride. Field oxide layer 12 is exposed following removal of that portion of oxide layer 22 that covers field oxide layer 12.

Figure 9:
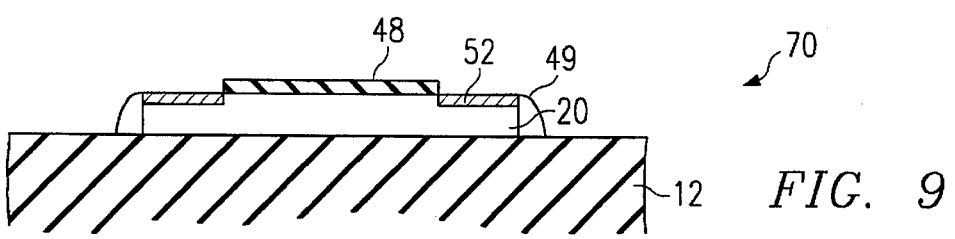
FIG. 9 provides a cross-sectional view of the complete resistor of the alternative embodiment after a titanium silicide annealing step.

The exposed polysilicon layer 20 is then silicided, as FIG. 9 shows, to form silicide layers 52. This completes the formation of alternative polysilicon resistor 70. Alternative polysilicon resistor 70 processing may also include a $TiSi_2$ anneal. The individual process steps necessary to form the intermediate and final fabrication process device that yield alternative polysilicon resistor 70 are described in more detail below.

A consideration of the process that produces alternative polysilicon resistor 70 is that when the $N^+$ source/drain implant occurs, there is no longer sufficient oxide/nitride on top of the resistor body to block the implant. The $N^+$ source/drain mask, therefore, leaves the resistor body covered with resist. In this case, the head implant, which is defined by the $N^+$ source/drain mask and the resistor body, which is defined by the silicide block pattern edge, will not be self-aligned. Other than this consideration the alternative polysilicon resistor 70 embodies similar inventive concepts and provides similar advantages to those of polysilicon resistor 10 of FIGS. 1 through 4, above.

The process flow to form alternative polysilicon resistor 50 proceeds essentially identical to that of forming polysilicon resistor 10 up to and including the step of performing an LPCVD nitride to a thickness of 1000 Å±100 Å. Thereafter, the process proceeds by performing a nitride sidewall etch to leave greater than 200 Å of oxide. The next step is to pattern an $N^+$ source/drain photoresist mask that exposes the polysilicon resistor heads, if desired. This results in essentially the structure of the alternative fabrication process device 50 in FIG. 6. Next, a first $N^+$ source/drain implant occurs using a $4 \times 10^{14}$ ion/cm$^2$ phosphorous implant at a 50 KeV energy level, followed by a second $N^+$ source/drain implant of $3 \times 10^{15}$ arsenic ions density at 120 KeV.

Photoresist ash and poly-ears resist strip processes occur next. Thereafter, a $P^+$ source/drain photoresist mask is formed on oxide layer 22. This implant is blocked from the entire resistor by photoresist. This permits a $P^+$ source/drain implant for which the alternative embodiment uses a $2 \times 10^{15}$ ion/cm$^2$ boron implant at an energy level of 20 KeV. To remove the photoresist, an ash and a poly-ears resist strip takes place next. After completing the desired $N^+$ source/ drain implants and desired $P^+$ source/drain implants, the next step is to perform a source/drain anneal. The present embodiment uses a thirty minute anneal at a temperature of approximately 850° C.

Figure 8:
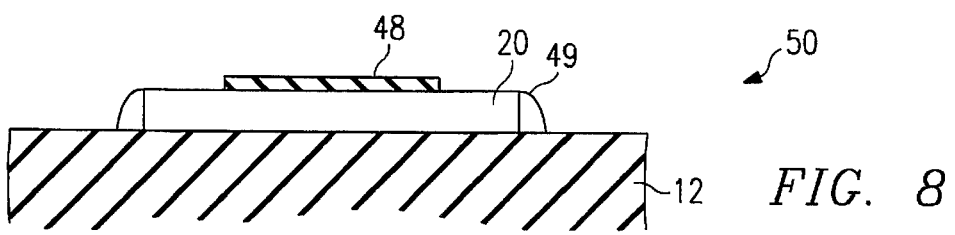
FIG. 8 illustrates the resulting formation of an oxide stack according to the alternative embodiment process of FIG. 5.

The next step forms a silicide block photoresist pattern 46 on oxide layer 22. This forms a pattern for leaving oxide on top of polysilicon resistor layer 20 and ESD structure to prevent silicidation. Thereafter, an oxide etch takes place to leave less than 20 Å of oxide in the etched areas, such as FIG. 8 illustrates. To remove photoresist pattern 46, the present method includes an ash process and a poly-ears resist strip process. Thereafter, a deglaze step occurs, preferably using a 10% hydrofluoric acid compound for 20 seconds.

The alternative polysilicon resistor 50 formation process continues by depositing titanium to a thickness of 600±50 Å followed by a reaction process at 585° C. for 45 minutes. Titanium and titanium nitride are then stripped using the megasonic stripping process for 30 minutes. Then, an anneal process takes place at a temperature of 750° C. for 30 minutes. In the present embodiment, the result is silicide layers 52. Finally, an MLO PETEOS deposition to deposit a 4500±250 Å MLO layer occurs.

In summary, the present embodiment provides a polysilicon resistor, that includes a field oxide layer and a polysilicon layer that covers a portion of the field oxide layer. The polysilicon layer produces a predetermined electrical resistance value. A dopant implants the polysilicon layer for determining the predetermined resistance value. A dielectric layer covers a predetermined portion of the polysilicon layer and forms at least one exposed location of the polysilicon layer. Furthermore, a silicide layer covers at least one exposed location of the polysilicon layer. The end result is an improved polysilicon resistor with less parasitic capacitance than conventional resistors possess.

There are any number of other alternatives or changes in the resulting structure and process flow which may be readily apparent to one of ordinary skill in the art. Such alternatives may not be employed in polysilicon resistor 40 or alternative polysilicon resistor 70 for any number of reasons, such as cost and performance considerations, packaging constraints, availability of materials, arbitrary design decisions and the like. A number of these alternatives have been mentioned above. This is, of course, done without limitation of other embodiments which may be equally obvious to one of ordinary skill in the art, but are not mentioned here because of time and space constraints.

In one alternative embodiment of the present invention, for example, there may be numerous other processing steps to form the preferred polysilicon resistor or its alternative embodiment. Thus, while the present invention has been described with reference to illustrative embodiments, these descriptions are not intended to be construed in a limiting sense. Various modifications and commendations of the illustrative embodiments, as well as other embodiments of the invention, will be apparent to persons skilled in the art upon reference to the embodiment description. It is, therefore, intended that the appended claims encompass any such modifications or embodiments.

What is claimed is:

1. A method for forming a polysilicon resistor on a field oxide region, comprising the steps of:

depositing a layer of polysilicon over said field oxide region;

patterning and etching said polysilicon layer to form a polysilicon structure over a portion of said field oxide region;

forming an oxide layer over said polysilicon structure and said field oxide region;

forming a nitride layer over said oxide layer;

etching said nitride layer to remove said nitride layer except on the portion of the oxide layer on the sidewalls of said polysilicon structure;

forming a pattern on said oxide layer to define the body of the polysilicon resistor;

etching said oxide layer to remove said oxide layer except under said pattern exposing a portion of said polysilicon structure;

removing said pattern; and forming a silicide layer on said exposed portion of the polysilicon structure.

2. The method of claim 1, further comprising the step of implanting a dopant into said polysilicon layer to adjust the sheet resistance of the polysilicon resistor prior to the step of patterning and etching the polysilicon layer.

3. The method of claim 2, wherein said step of implanting the polysilicon layer comprises implanting arsenic at a dose of about 6.0E15 ion/cm$^2$ and an energy of about 150 KeV.

4. The method of claim 2, further comprising the step of annealing the polysilicon layer to diffuse and activate the dopant throughout the polysilicon layer.

5. The method of claim 1, further comprising the step of implanting a source/drain dopant through said oxide layer into said polysilicon structure after said step of forming a pattern and prior to said step of etching said oxide layer.

6. A method for forming a polysilicon resistor on a field oxide region, comprising the steps of:

depositing a layer of polysilicon over said field oxide region;

patterning and etching said polysilicon layer to form a polysilicon structure over a portion of said field oxide region;

forming an oxide layer over said polysilicon structure;

forming a nitride layer over said oxide layer;

forming a pattern on said nitride layer to define the body of the polysilicon resistor;

etching said nitride layer to remove said nitride layer except under said pattern and on the portion of the oxide layer on the sidewalls of said polysilicon structure;

removing said pattern;

etching said oxide layer to remove said oxide layer except on the sidewalls of said polysilicon layer and under said etched nitride layer exposing a portion of said polysilicon structure; and forming a silicide layer on said exposed portion of the polysilicon structure.

* * * * *